(12) United States Patent
Hayes

(10) Patent No.: US 6,808,216 B2
(45) Date of Patent: Oct. 26, 2004

(54) METHODS AND APPARATUS FOR HANDLING WORKPIECES

(75) Inventor: Brook A. Hayes, Cross Plains, WI (US)

(73) Assignee: Cardinal IG Company, Eden Prairie, MN (US)

( * ) Notice: Subject to any disclaimer, the term of this patent is extended or adjusted under 35 U.S.C. 154(b) by 139 days.

(21) Appl. No.: 10/232,290

(22) Filed: Aug. 30, 2002

(65) Prior Publication Data

US 2004/0041420 A1 Mar. 4, 2004

(51) Int. Cl.$^7$ ................................................. B25J 15/06
(52) U.S. Cl. ........................................ 294/64.1; 901/40
(58) Field of Search ........................ 294/64.1, 65, 902; 901/40; 414/627, 737, 752.1; 271/91, 94

(56) References Cited

U.S. PATENT DOCUMENTS

| 2,341,621 A | * | 2/1944 | Johnson ...................... 294/64.1 |
| 2,871,054 A | * | 1/1959 | Zinke ......................... 294/64.1 |
| 3,377,096 A | * | 4/1968 | Wood ......................... 294/64.1 |
| 3,627,369 A | * | 12/1971 | Nixon ......................... 294/64.1 |
| 3,833,230 A | | 9/1974 | Noll |
| 3,875,373 A | | 4/1975 | Lowery et al. |
| 4,006,929 A | | 2/1977 | Barker |
| 4,009,785 A | | 3/1977 | Trayes |
| 4,129,328 A | | 12/1978 | Littell |
| 4,200,420 A | | 4/1980 | Cathers et al. |
| 4,228,993 A | | 10/1980 | Cathers |
| 4,460,208 A | | 7/1984 | Hoffman |
| 4,600,229 A | | 7/1986 | Oten |
| 4,735,449 A | | 4/1988 | Kuma |
| 4,806,070 A | | 2/1989 | Poux et al. |
| 4,852,926 A | | 8/1989 | Littell |
| 4,904,012 A | | 2/1990 | Nishiguchi et al. |
| 5,172,949 A | | 12/1992 | Nagai et al. |
| 5,192,070 A | | 3/1993 | Nagai et al. |
| 5,193,796 A | | 3/1993 | Nagai et al. |
| 5,213,385 A | | 5/1993 | Nagai et al. |
| 5,961,169 A | * | 10/1999 | Kalenian et al. ........... 294/64.1 |
| 6,032,997 A | | 3/2000 | Elliott et al. |
| 6,135,522 A | * | 10/2000 | Su et al. ..................... 294/64.1 |
| 6,669,428 B2 | * | 12/2003 | Autterson et al. .......... 411/531 |

OTHER PUBLICATIONS www.Vi–cas.thomasregister.com/OIC/Vi–cas/Vacuum.htm Printed Nov. 6, 2002.
www.Vi–cas.thomasregister.com/OIC/Vi–cas/rubbrcup.htm Printed Nov. 6, 2002.

* cited by examiner

Primary Examiner—Dean J. Kramer
(74) Attorney, Agent, or Firm—Allen W. Groenke; Fredrikson & Byron, P.A.

(57) ABSTRACT

Methods and apparatus for grasping and moving workpieces are disclosed. A device in accordance an exemplary embodiment of the present invention comprises a disk including an outer edge. The disk has a generally planar resting shape in which the disk has a first diameter and a first edge length. A apparatus for holding the disk in a folded shape in which the disk defines a cavity is also provided. In a preferred embodiment, the disk is in an unstretched state while the disk is assuming the folded shape so that the disk may assume the resting shape by unfolding without unstretching. Also in a preferred embodiment, the disk has a second diameter and a second edge length while the disk is assuming the folded shape, where the second diameter is smaller than the first diameter and the second edge length is substantially equal to the first edge length.

45 Claims, 9 Drawing Sheets

METHODS AND APPARATUS FOR HANDLING WORKPIECES

FIELD OF THE INVENTION

The present invention relates generally to methods and apparatus for grasping and moving workpieces. More particularly, the present invention relates to methods and apparatus for grasping and/or moving workpieces which are sensitive to contamination and/or fragile.

BACKGROUND OF THE INVENTION

Today, many products are produced inexpensively and in high volume using highly mechanized and/or automated manufacturing techniques. Examples of workpieces which are sometimes handled using mechanized and/or automated equipment include transparent glass panes, glass mirrors, and semiconductors (e.g., wafers, chips, and dies). When practicing such manufacturing techniques, it is often necessary for a machine to grasp and move a workpiece. This may be accomplished using some sort of gripper.

In some cases, the material of the gripper may leave residue on the workpiece. Additionally, relative movement between the gripper and the workpeice (e.g., rubbing) may cause damage to the workpiece in some cases. Thus, it is desirable to efficiently grasp and transfer workpieces while at the same time minimizing contamination of the workpiece and damage to the workpiece.

SUMMARY OF THE INVENTION

The present invention relates generally to methods and apparatus for grasping and moving workpieces. More particularly, the present invention relates to methods and apparatus for grasping and/or moving workpieces which are sensitive to contamination and/or fragile. An assembly in accordance with an exemplary implementation of the present invention includes a disk and a cup shaped member having a mid portion fixed to a central portion of the disk. A skirt of the cup shaped member may be advantageously dimensioned to urge an outer portion of the disk out of plane with a central portion of the disk so that the disk defines a cavity when the skirt is disposed in a resting shape. The skirt may also advantageously have a level a resilience selected to allow the skirt to assume a stretched shape while the disk is assuming a generally planar condition.

In one aspect of the present invention, the disk is interposed between the cup shaped member and a workpiece. Accordingly, in some implementations, the disk advantageously prevents the cup shaped member from contacting the workpiece. Additionally, the disk may advantageously prevent the skirt of the cup shaped member from rubbing on the workpiece, for example, when skirt stretches to assume a stretched shape.

A method of moving a workpiece in accordance with an exemplary implementation of the present invention comprises the steps of providing a disk having a generally planar condition and urging an outer portion of the disk out of plane with a central portion of the disk so that the disk defines a cavity. A source of relatively low pressure is placed in fluid communication with the cavity defined by the disk and the disk is positioned against a workpiece. The workpiece may be moved, for example, by moving the disk while the disk is positioned against the workpiece.

In some advantageous implementations of the present invention, the disk is adapted to move between a planar condition and a folded condition by folding and unfolding without significant stretching and unstretching. More particularly, the length of an edge of the disk preferably remains substantially unchanged as the disk moves between a planar condition and a folded condition. A disk which moves between a planar condition and a folded condition by folding and unfolding without significant stretching and unstretching may conform to the face of a generally planar workpiece with minimal rubbing between the disk and the workpiece.

In some advantageous implementations of the present invention, the skirt of the cup shaped member comprises an elastomeric material and the disk comprises a non-elastomeric material. When this is the case, the elastomeric material forming the skirt may allow the skirt to assume a stretched shape. Also in these advantageous implementations, the nonelastomeric material forming the disk may allow the disk to move between a planar condition and a folded condition by folding and unfolding without significant stretching and unstretching of the material forming disk.

A disk assembly in accordance with an exemplary implementation of the present invention may include a disk having a first surface and an annular ring of adhesive disposed on the first surface of the disk. An inner extent of the adhesive and an inner perimeter of the disk define a first adhesive free portion of the disk. In some advantageous implementations of the present invention, this first adhesive free portion is dimensioned to prevent the adhesive from extruding beyond the inner perimeter of the disk. In certain advantageous implementations, an outer extent of the adhesive and an outer perimeter of the disk define a second adhesive free portion of the disk. In certain particularly advantageous implementations of the present invention, this second adhesive free portion is dimensioned to prevent the adhesive from extruding beyond the outer perimeter of the disk.

DETAILED DESCRIPTION OF THE PREFERRED EMBODIMENT

The following detailed description should be read with reference to the drawings, in which like elements in different drawings are numbered identically. The drawings, which are not necessarily to scale, depict selected embodiments and are not intended to limit the scope of the invention. Examples of constructions, materials, dimensions, and manufacturing processes are provided for selected elements. All other elements employ that which is known to those of skill in the field of the invention. Those skilled in the art will recognize that many of the examples provided have suitable alternatives that can be utilized.

Figure 1:
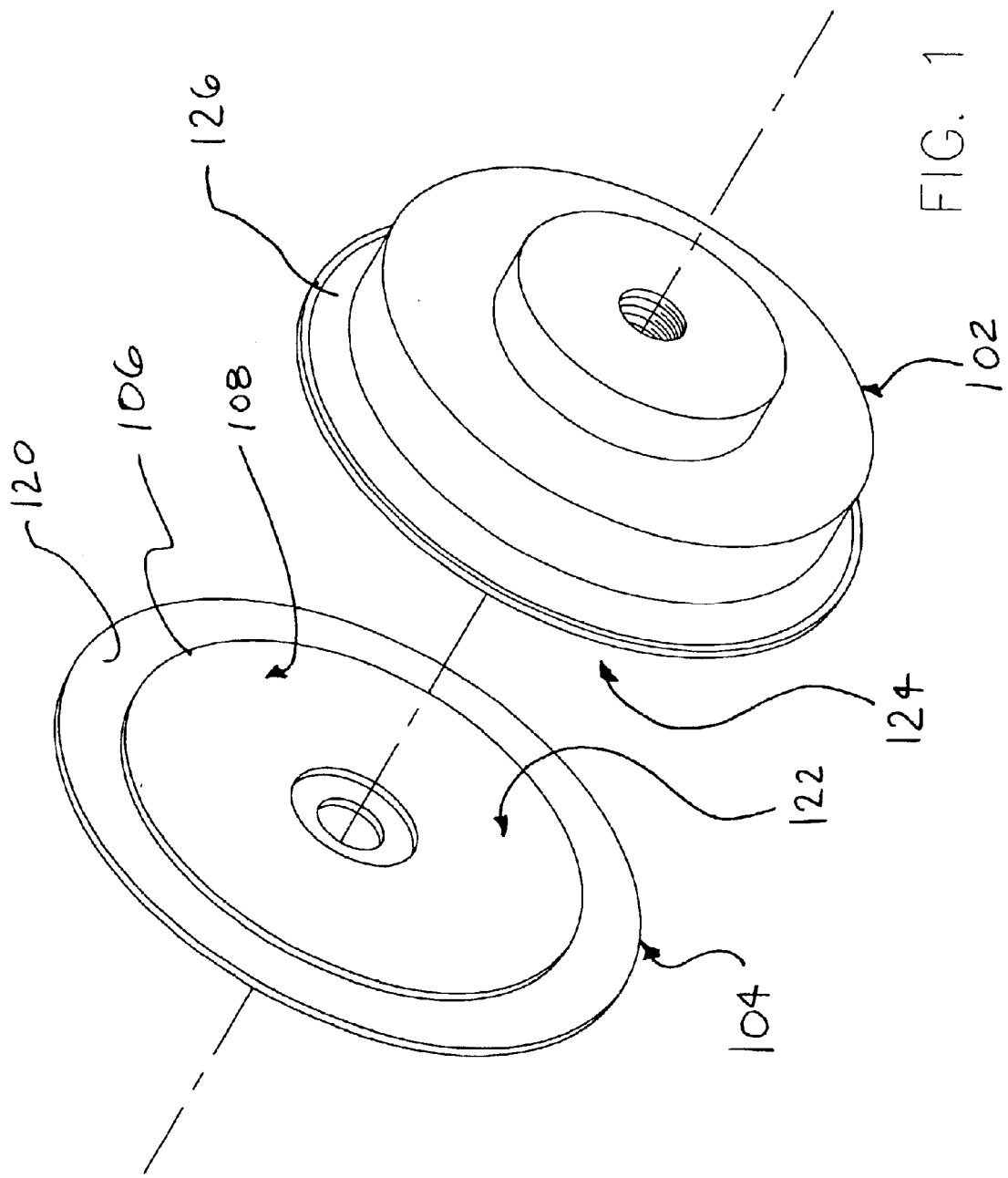
FIG. 1 is an exploded perspective view of an assembly in accordance with an exemplary embodiment of the present invention.

FIG. 1 is an exploded perspective view of an assembly in accordance with an exemplary embodiment of the present invention. The assembly of FIG. 1 includes a generally cup shaped member 102 and a disk 104. In FIG. 1, disk 104 is shown having a generally planar shape. An adhesive 106 is disposed on an adhesive covered portion 108 of a first surface 120 of disk 104. In some embodiments of the present invention, adhesive 106 is dimensioned for fixing a central portion 122 of disk 104 to a mid portion 124 of cup shaped member 102. In the embodiment of FIG. 1, cup shaped member 102 includes a skirt 126 disposed about mid portion 124. In some embodiments of the present invention, skirt 126 is dimensioned to urge disk 104 to assume a folded shape when central portion 122 of disk 104 is fixed to mid portion 124.

Figure 2:
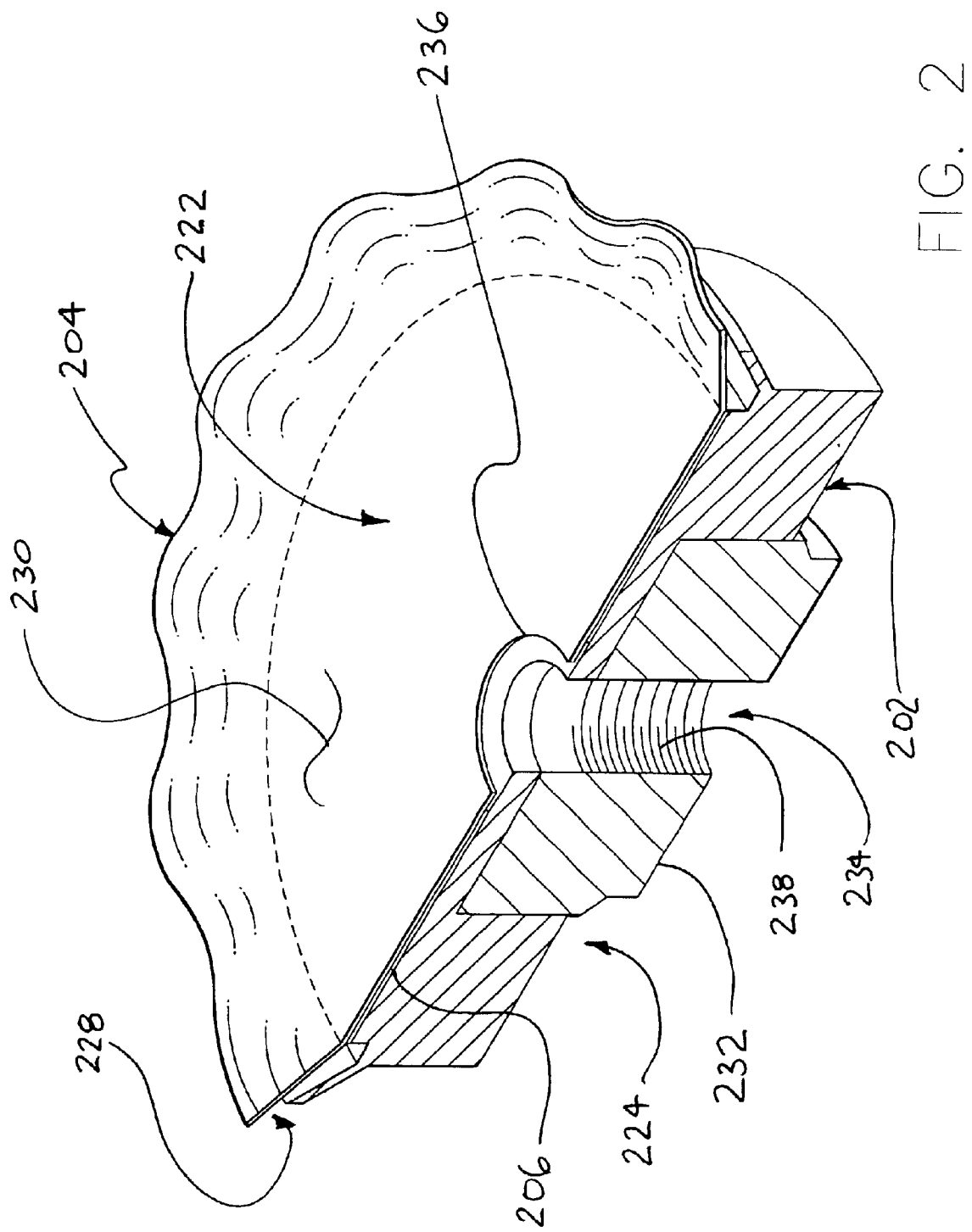
FIG. 2 is a cross sectional perspective view of an assembly in accordance with an exemplary embodiment of the present invention.

FIG. 2 is a cross sectional perspective view of an assembly in accordance with an exemplary embodiment of the present invention. The assembly of FIG. 2 includes a generally cup shaped member 202 and a disk 204. In the embodiment of FIG. 2, a central portion 222 of disk 204 is fixed to a mid portion 224 of cup shaped member 202 by an adhesive 206. In the embodiment of FIG. 2, an outer portion 228 of disk 204 is disposed in an out of plane relationship with central portion 222 of disk 204.

In the embodiment of FIG. 2 it may be appreciated that disk 204 defines a cavity 230. A hub 232 of cup shaped member 202 defines a lumen 234 which communicates with cavity 230 via a hole 236 defined by disk 204. In the embodiment of FIG. 2, a thread 238 is disposed within lumen 234. Lumen 234 and thread 238 may be adapted to receive a suitable fitting so that a source of relatively low pressure (e.g., vacuum) can be selectively connected to cavity 230.

Figure 3:
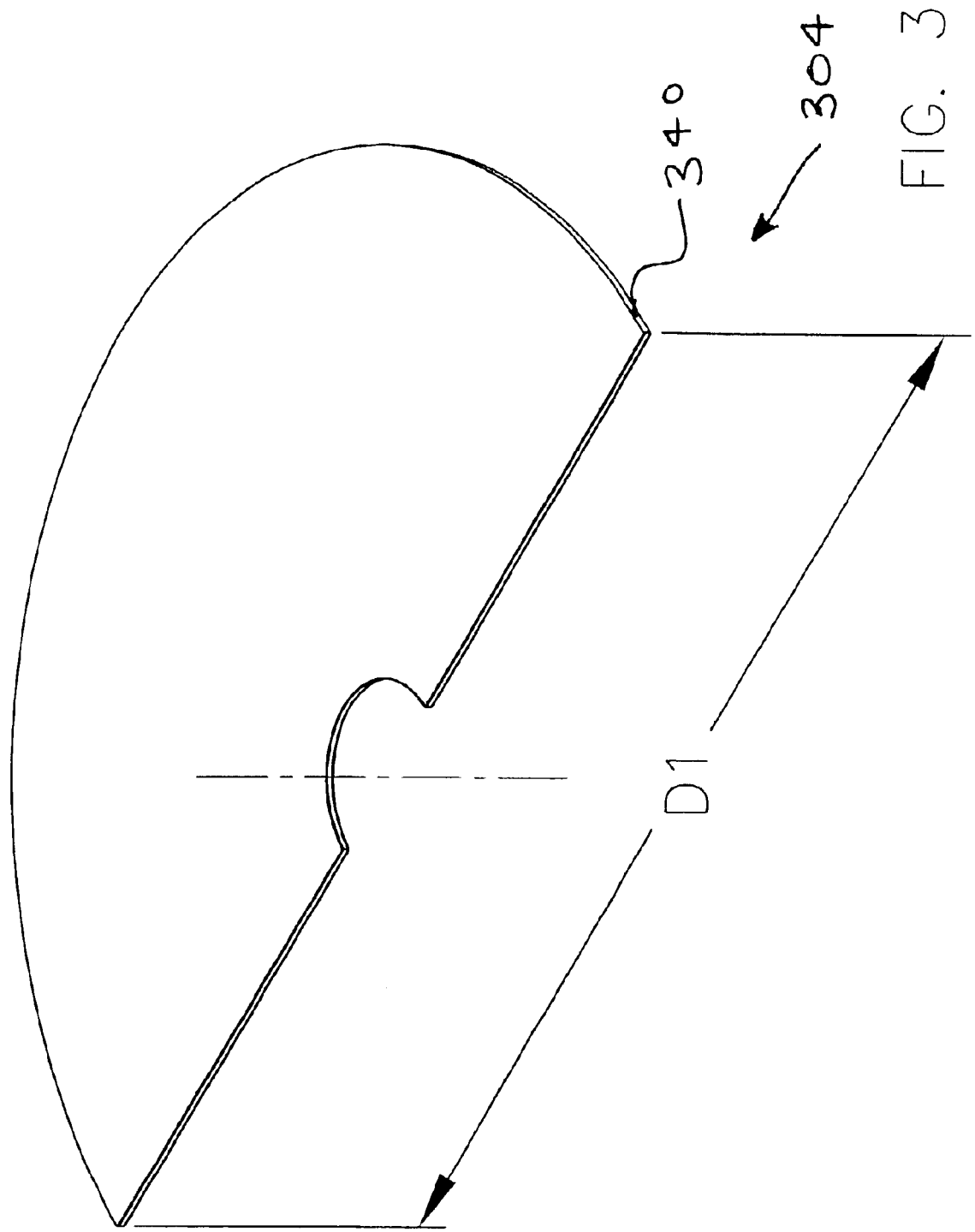
FIG. 3 is a cross sectional perspective view of a disk in accordance with an exemplary embodiment of the present invention.

FIG. 3 is a cross sectional perspective view of a disk 304 in accordance with an exemplary embodiment of the present invention. In the embodiment of FIG. 3, disk 304 is disposed in a generally planar condition in which disk 304 has a first diameter D1. Disk 304 includes an edge 340 having a length. In the embodiment of FIG. 3, the length of edge 340 is preferably substantially equal to the circumference of disk 304.

Figure 4:
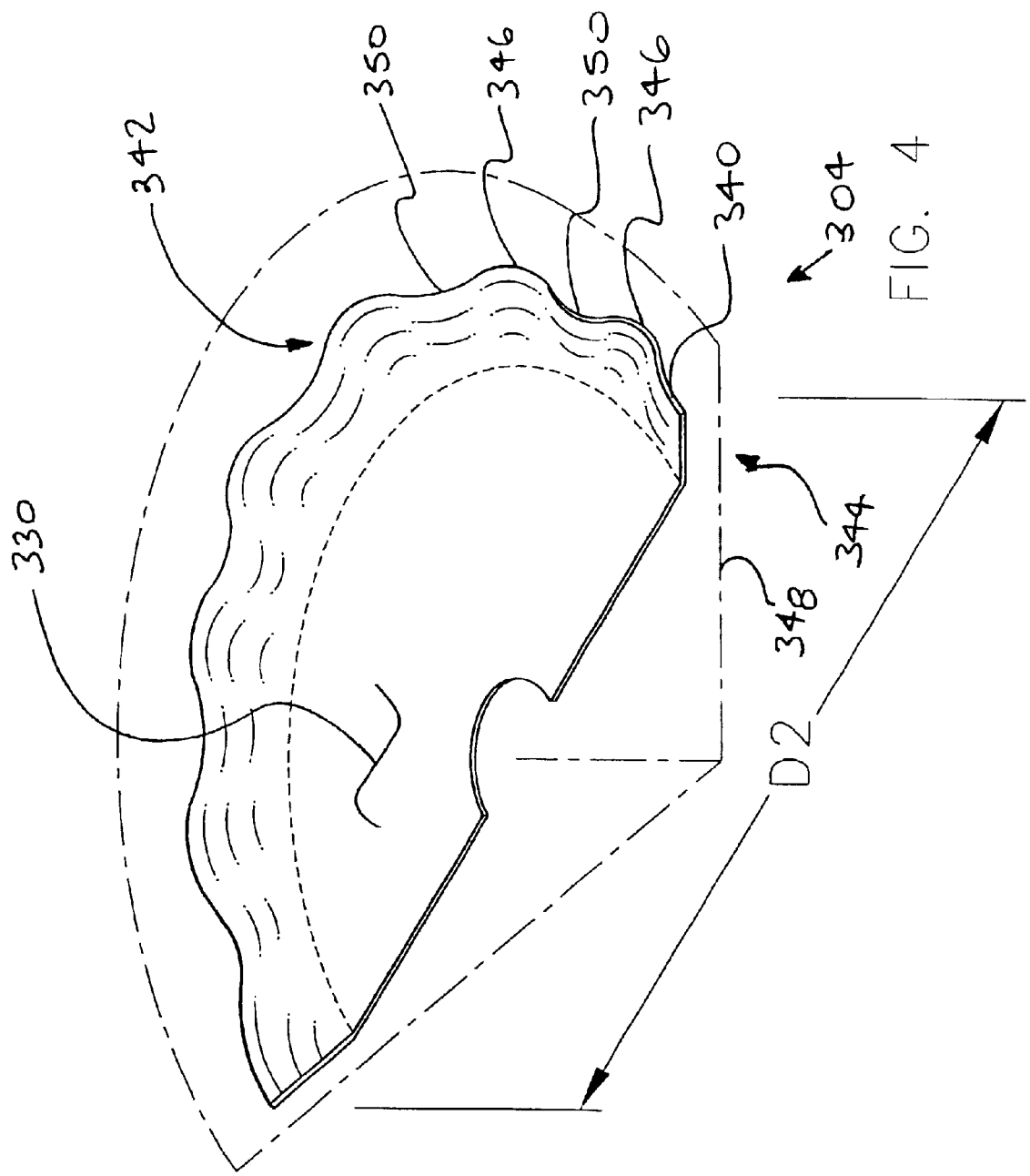
FIG. 4 is an additional cross sectional perspective view of disk shown in the previous figure.

FIG. 4 is an additional cross sectional perspective view of disk 304 shown in the previous figure. In the embodiment of FIG. 4, disk 304 is disposed in a folded condition in which disk 304 defines a cavity 330. A second diameter D2 of disk 304 is illustrated in FIG. 4.

In some embodiments of the present invention, disk 304 is adapted to move between a planar condition and a folded condition by folding and unfolding without significant stretching and unstretching. In some of these embodiments, the length of edge 340 of disk 304 preferably remains substantially unchanged as disk 304 moves between a planar condition and a folded condition. In certain embodiments of the present invention, disk 304 comprises a non-elastomeric material. A disk 304 which moves between a planar condition and a folded condition by folding and unfolding without significant stretching and unstretching may conform to the face of a generally planar workpiece with minimal rubbing between the disk and the workpiece.

In FIG. 4 it may be appreciated that a plurality of undulations 342 are formed along a periphery 344 of disk 304 while disk 304 is in the illustrated folded condition. In the embodiment of FIG. 4, undulations 342 include a plurality of valleys 346 which define a first cone 348. Also in the embodiment of FIG. 4, undulations 342 include a plurality of peaks 350 which define a second cone. In the embodiment of FIG. 4, the first cone defined by valleys 346 and the second cone defined by peaks 350 are generally coaxial with one another.

Figure 5:
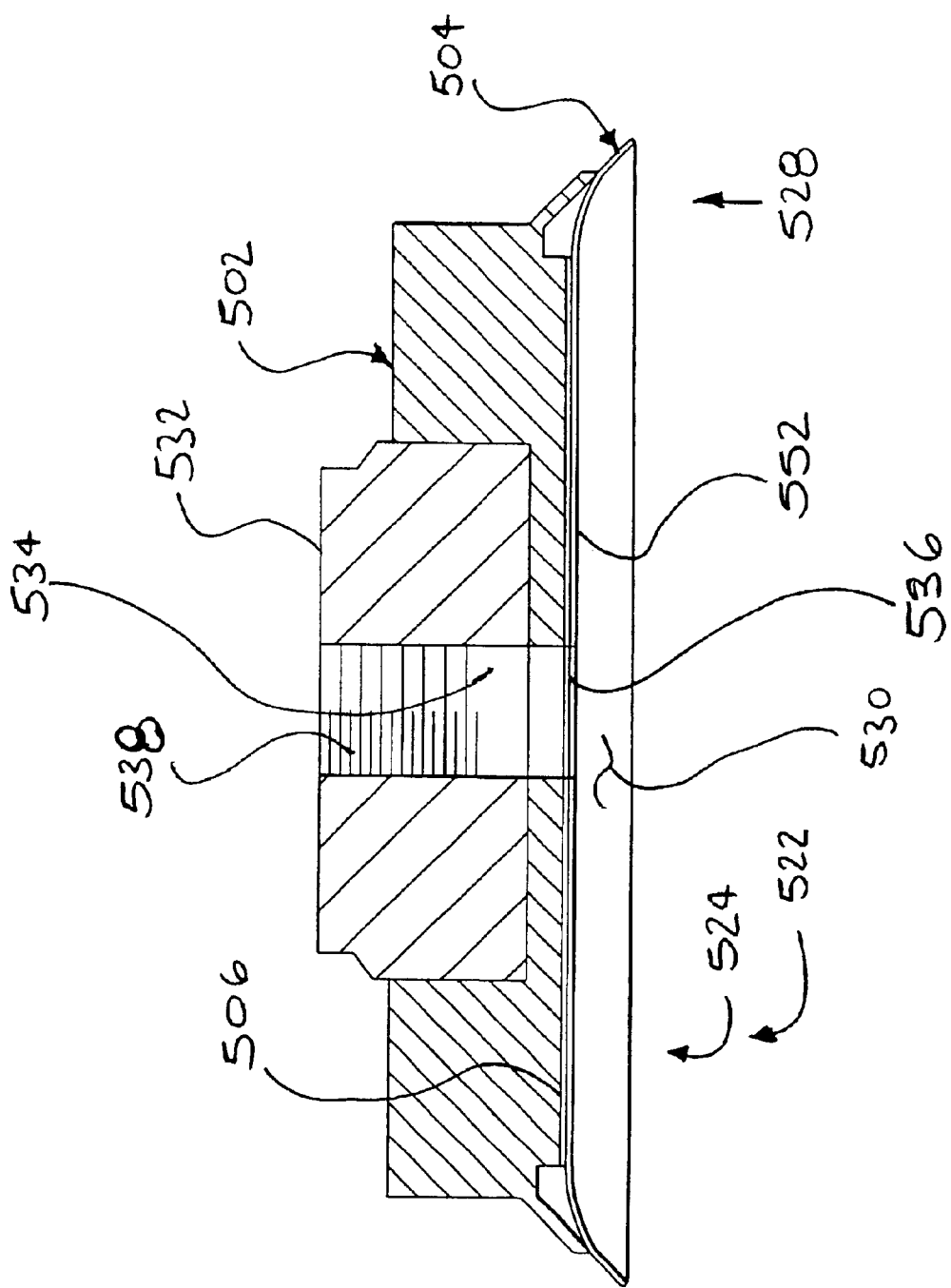
FIG. 5 is a cross sectional view of an assembly in accordance with an exemplary embodiment of the present invention.

FIG. 5 is a cross sectional view of an assembly in accordance with an exemplary embodiment of the present invention. The assembly of FIG. 5 includes a generally cup shaped member 502 and a disk 504. In the embodiment of FIG. 5, a central portion 522 of disk 504 is fixed to a mid portion 524 of cup shaped member 502 by an adhesive 506. In the embodiment of FIG. 5, central portion 522 of disk 504 defines a plane 552, and an outer portion 528 of disk 504 is disposed out of plane relative to central portion 522 of disk 504.

In the embodiment of FIG. 5 it may be appreciated that disk 504 defines a cavity 530. A hub 532 of cup shaped member 502 defines a lumen 534 which communicates with cavity 530 via a hole 536 defined by disk 504. In the embodiment of FIG. 5, a thread 538 is disposed within lumen 534. Lumen 534 and thread 538 may be adapted to receive a suitable fitting so that a source of relatively low pressure (e.g., vacuum) can be selectively connected to cavity 530.

One method of moving a workpiece in accordance with an exemplary embodiment of the present invention comprises the steps of providing a disk having a generally planar shape and urging an outer portion of the disk out of plane with a central portion of the disk so that the disk defines a cavity. A source of relatively low pressure is placed in fluid communication with the cavity defined by the disk and the disk is positioned against a workpiece. The workpiece may be moved, for example, by moving the disk while the disk is positioned against the workpiece.

In some advantageous methods in accordance of the present invention, disk 504 changes between a planar shape and a folded shape by folding and unfolding without significant stretching and unstretching of the material forming disk 504. In these advantageous methods, disk 504 may be unfolded onto the surface of a workpiece and rubbing contact between disk 504 and the workpiece may be minimized.

Figure 6:
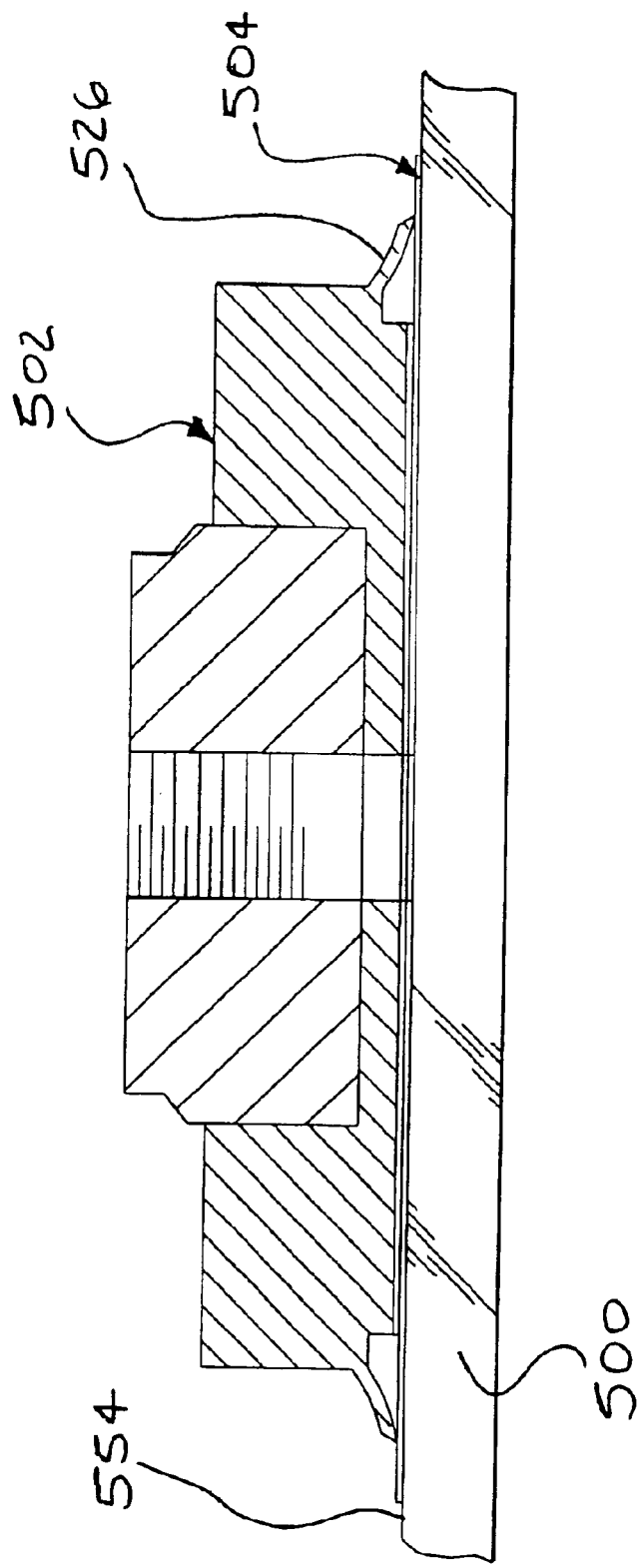
FIG. 6 is a cross sectional view of an assembly including cup shaped member and disk shown in the previous figure.

FIG. 6 is a cross sectional view of an assembly including cup shaped member 502 and disk 504 shown in the previous figure. In the embodiment of FIG. 6, disk 504 is shown overlaying a generally planar surface 554 of a workpiece 500. In FIG. 6, it may be appreciated that disk 504 has assumed a generally planar shape. In FIG. 6 it may also be appreciated that skirt 526 of cup shaped member 502 has assumed a stretched shape. In some embodiments of the present invention, skirt 526 has a level a resilience which allows skirt 526 to selectively assume a stretched shape while disk 504 is disposed in a generally planar condition.

In some embodiments of the present invention, skirt 526 of cup shaped member 502 comprises an elastomeric material and disk 504 comprises a non-elastomeric material. When this is the case, the elastomeric material forming skirt 526 may allow skirt 526 to assume a stretched shape. Additionally, the non-elastomeric material forming disk 504 may allow disk 504 to move between a planar condition and a folded condition by folding and unfolding without significant stretching and unstretching of the material forming disk 504. The term elastomeric generally refers to a rubber like material (e.g., a material which can experience about a 5% stretch and return to the undeformed configuration). Examples of elastomeric materials include rubber (e.g., natural rubber, silicone rubber, nitrile rubber, polysulfide rubber, etc.), thermoplastic elastomer (TPE), butyl, polyurethane, and neoprene. Vacuum cups which may be suitable for use with the present invention are commercially available from Vi-Cas Manufacturing Company of Cincinnati, Ohio, USA. These vacuum cups are available in a material which the company identifies as vinyl.

It will be appreciated that disk 504 may comprise various materials without deviating from the spirit and scope of the present invention. Examples of materials which may be suitable in some applications include: polyethylene (e.g., low density polyethylene), polypropylene (PP), polytetrafluoroethylene (PTFE), polyester (e.g., PET), polyamide, and polyimide.

In FIG. 6 disk 504 is shown interposed between cup shaped member 502 and workpiece 500. Accordingly, it may be appreciated that disk 504 prevents cup shaped member 502 from contacting workpiece 500 in the embodiment of FIG. 6. In some embodiments of the present invention, as mentioned above, skirt 526 of cup shaped member 502 comprises an elastomeric material and disk 504 comprises a non-elastomeric material. Elastomeric materials are useful in these embodiments, because they provide cup shaped member 502 with the ability to assume a stretched shape. In some applications, however, elastomeric materials may leave residue on the workpiece when they are allowed to contact the workpiece (e.g., glass window panes and semiconductors). The residue left by the elastomeric material may comprise, for example, fine particles of elastomeric material which have been pressed into micro fissures in the workpiece and/or plastisizers which have leached out of the elastomeric material. When handling cosmetically critical workpieces (e.g., glass window panes and glass mirrors) any residue left on the workpiece will be particularly noticeable. Even when the residue is not noticeable under ordinary conditions, it may become readily apparent in other conditions. For example, when a bathroom mirror fogs up while a person takes a shower the droplets of water condensing on the glass can be seen to selectively condense on the areas of the mirror that do not contain any residue.

In the embodiment of FIG. 6 disk 504 is interposed between skirt 526 of cup shaped member 502 and workpiece 500. When this is the case, disk 504 will preferably prevent skirt 526 from rubbing on workpiece 500, for example, when skirt stretches to assume a stretched shape. When handling semiconductors (e.g., wafers, chips, and dies) relative movement between the workpiece and another object may cause damage to active areas of the semiconductor. Examples of such active areas may include bonding pads, transistors, conductive paths, etc.

Figure 7:
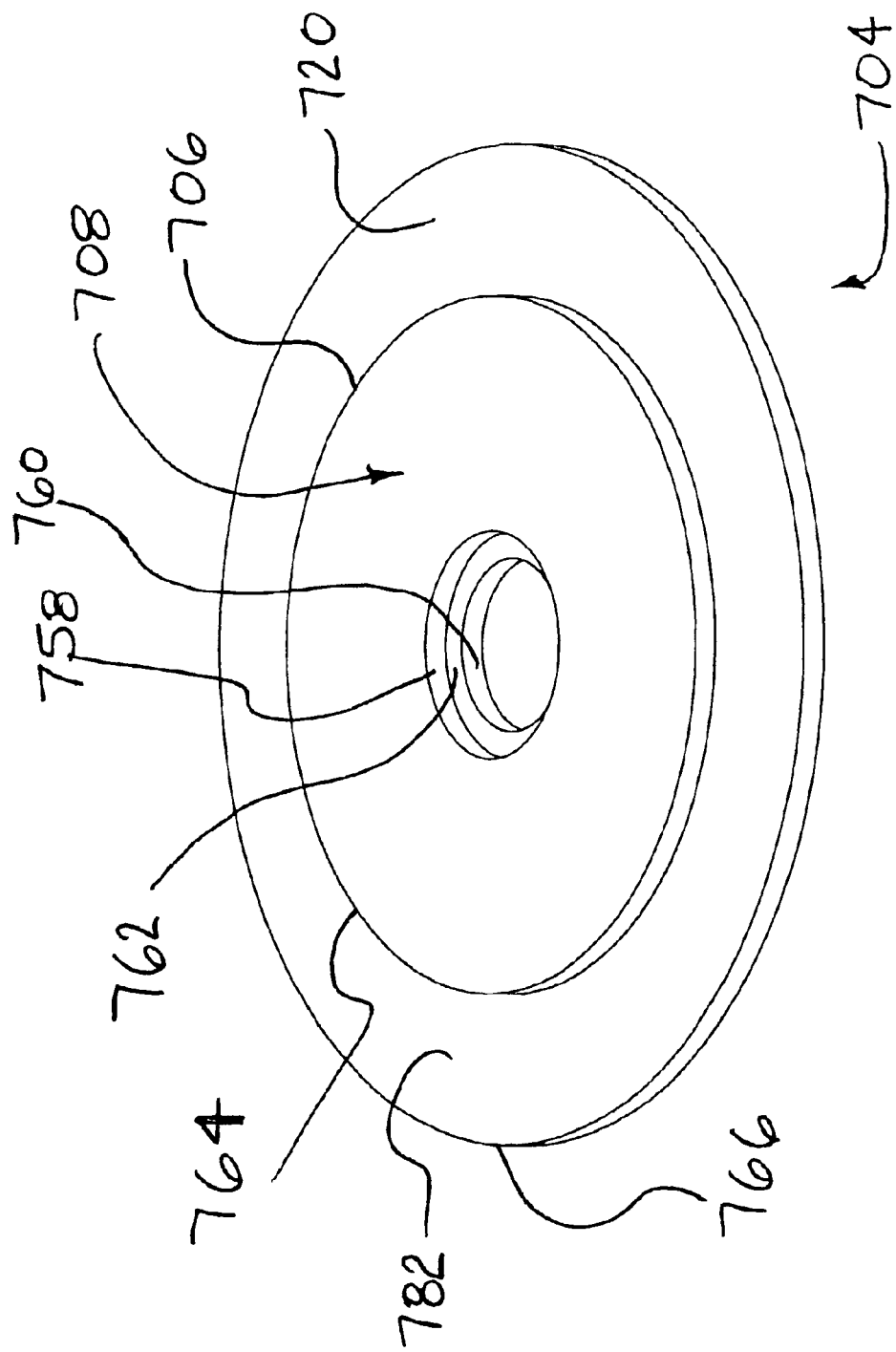
FIG. 7 is a perspective view of a disk in accordance with an exemplary embodiment of the present invention.

FIG. 7 is a perspective view of a disk 704 in accordance with an exemplary embodiment of the present invention. In the embodiment of FIG. 7, disk 704 is disposed in a generally planar shape. An adhesive 706 is disposed on an adhesive covered portion 708 of a first surface 720 of disk 704. An inner extent 758 of adhesive 706 and an inner perimeter 760 of disk 704 define a first adhesive free portion 762 of disk 704. In some advantageous embodiments of the present invention, first adhesive free portion 762 of disk 704 is dimensioned to prevent adhesive 706 from extruding beyond inner perimeter 760 of disk 704. An outer extent 764 of adhesive 706 and an outer perimeter 766 of disk 704 define a second adhesive free portion 782 of disk 704. In some advantageous embodiments of the present invention, second adhesive free portion 782 of disk 704 is dimensioned to prevent adhesive 706 from extruding beyond outer perimeter 766 of disk 704.

Figure 8:
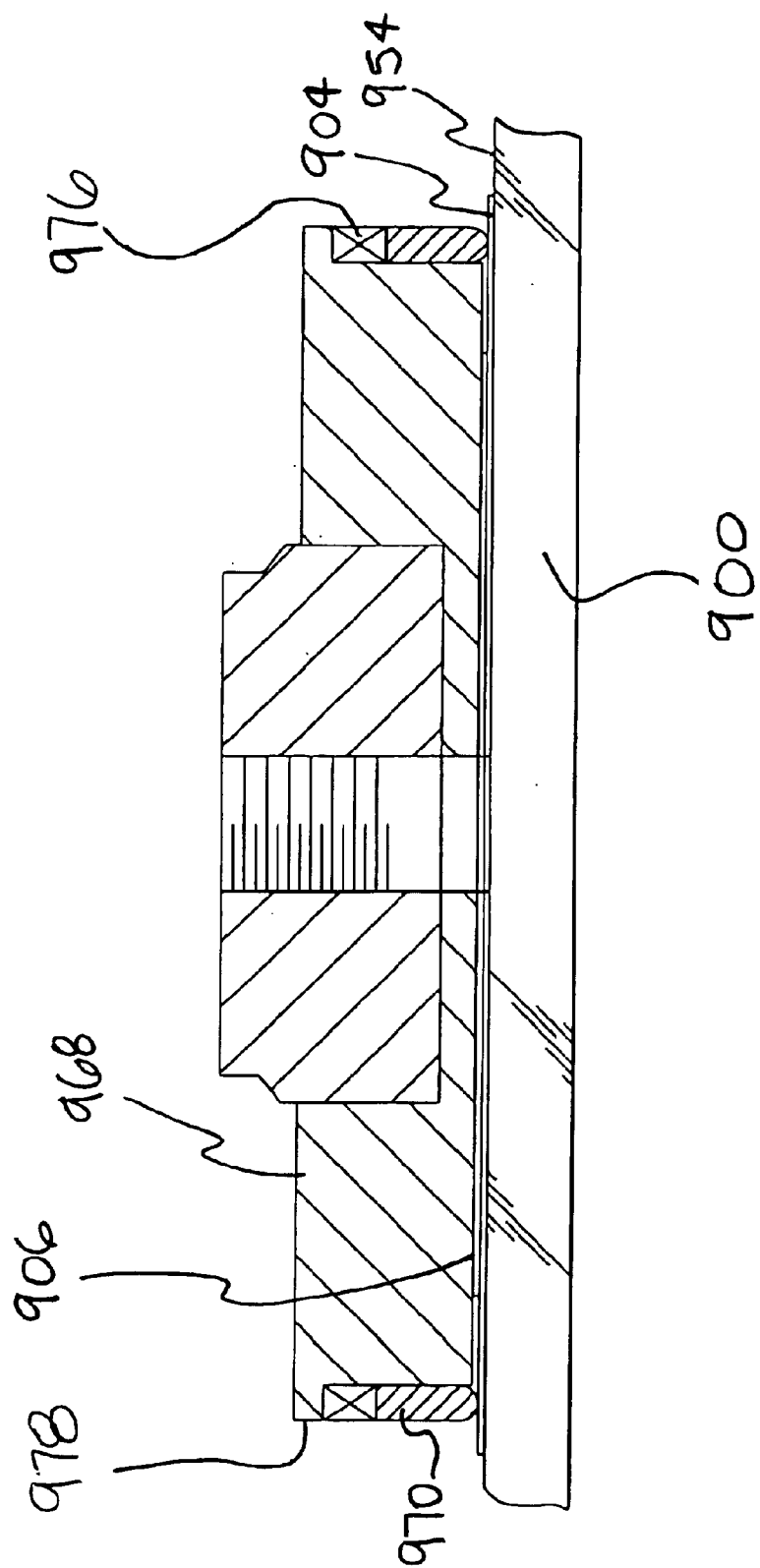
FIG. 8 is a cross sectional view of an assembly in accordance with an additional exemplary embodiment of the present invention.

FIG. 8 is a cross sectional view of an assembly in accordance with an additional exemplary embodiment of the present invention. The assembly of FIG. 8 includes a disk 904 having a central portion that is fixed to a body 968 by an adhesive 906. In the embodiment of FIG. 8, disk 904 is shown overlaying a generally planar surface 954 of a workpiece 900. In FIG. 8, it may be appreciated that disk 904 has assumed a generally planar shape.

In FIG. 8, a collar 970 is shown disposed about body 968. In a preferred embodiment of the present invention, collar 970 is biased to press against workpiece 900. Various mechanisms may be used to urge collar 970 towards workpiece 900 including, for example, pneumatic mechanisms (e.g., piston and cylinder arrangements), spring mechanisms, and electrical mechanisms (e.g., solenoids). In the embodiment of FIG. 8, a resilient ring 976 is disposed between collar 970 and a shoulder 978 of body 968. Resilient ring 976 may comprise various elements without deviating from the spirit and scope of the present invention. Examples of elements which may be suitable in some applications include an elastomeric annulus and a wave spring.

Figure 9:
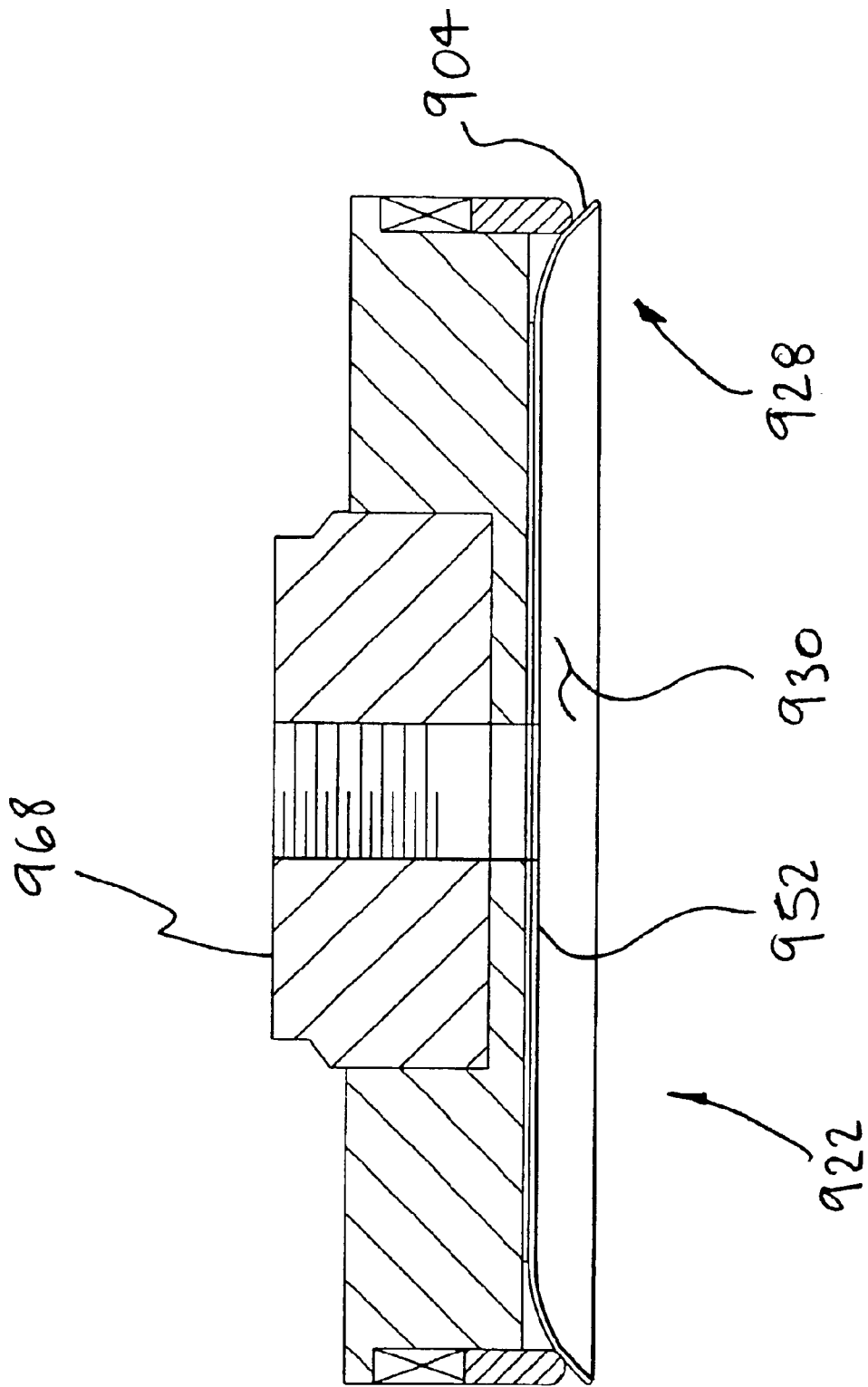
FIG. 9 is a cross sectional view of an assembly including a body and a disk.

FIG. 9 is a cross sectional view of an assembly including body 968 and disk 904 shown in the previous figure. In the embodiment of FIG. 9, a central portion 922 of disk 904 defines a plane 952, and an outer portion 928 of disk 904 is disposed out of plane relative to central portion 922 of disk 904 so that disk 904 defines a cavity 930.

Several forms of invention have been shown and described, and other forms will now be apparent to those skilled in art. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. An assembly, comprising:

a disk having an outer edge;

the disk having a generally planar resting condition in which the disk has a first diameter and a first edge length;

a means for holding the disk in a folded condition in which the disk defines a cavity;

the means for holding the disk in the folded condition comprising a cup shaped member having a mid portion fixed to a central portion of the disk and a skirt disposed about the mid portion of the cup shared member;

the skirt being dimensioned to urge an outer portion of the disk out of plane with a central portion of the disk so that the disk defines a cavity when the skirt is disposed in a resting shape; and the skirt having a level a resilience allowing the skirt to assume a stretched shape while the disk is assuming a generally planar condition;

wherein the disk comprises a first material and the skirt of the cup shaped member comprises a second material different from the first material; and wherein the first material comprises a non-elastomeric material and the second material comprises an elastomeric material.

2. The assembly of claim 1, wherein the disk is substantially unstretched while the disk is in the folded condition.

3. The assembly of claim 1, wherein the disk has a second diameter and a second edge length while the disk is in the folded condition;

the second diameter being smaller than the first diameter; and the second edge length being substantially equal to the first edge length.

4. The assembly of claim 1, wherein the disk comprises low density polyethylene.

5. An assembly, comprising:

a disk having an outer edge;

the disk having a generally planar resting condition in which the disk has a first diameter and a first edge length; and a means for holding the disk in a folded condition in which the disk defines a cavity;

wherein the disk forms a plurality of undulations along a periphery of the disk while the disk is in the folded condition.

6. The assembly of claim 5, wherein the undulations include a plurality of valleys defining a first cone.

7. The assembly of claim 6, wherein the undulations include a plurality of peaks defining a second cone.

8. The assembly of claim 7, wherein the second cone is coaxial with the first cone.

9. The assembly of claim 5, wherein the disk is substantially unstretched while the disk is in the folded condition.

10. The assembly of claim 5, wherein the disk has a first diameter and a first edge length while the disk is in the generally planar resting condition;

wherein the disk has a second diameter and a second edge length while the disk is in the folded condition;

the second diameter being smaller than the first diameter; and the second edge length being substantially equal to the first edge length.

11. An assembly, comprising:

a cup shaped member including a mid portion and a skirt disposed about the mid portion;

a disk having a central portion fixed to the mid portion of the cup shaped member and an outer portion extending over the skirt of the cup shaped member;

the skirt of the cup shaped member urging the disk to assume a folded condition in which the disk defines a cavity; and wherein the disk is fixed to the cup shaped member by an adhesive.

12. The assembly of claim 11, wherein the disk is substantially unstretched while the disk is in the folded condition.

13. The assembly of claim 11, wherein the disk has a first diameter and a first edge length while the disk is in a generally planar condition;

wherein the disk has a second diameter and a second edge length while the disk is in the folded condition;

the second diameter being smaller than the first diameter; and the second edge length being substantially equal to the first edge length.

14. The assembly of claim 11, wherein the skirt is dimensioned to urge an outer portion of the disk out of plane with a central portion of the disk so that the disk defines a cavity when the skirt is disposed in a resting shape.

15. The assembly of claim 11, wherein the skirt has a level a resilience allowing the skirt to assume a stretched shape while the disk is assuming a generally planar condition.

16. The assembly of claim 11, wherein the disk comprises a first material and the cup shaped member comprises a second material different from the first material.

17. An assembly, comprising:

a cup shaped member including a mid portion and a skirt disposed about the mid portion;

a disk having a central portion fixed to the mid portion of the cup shaped member and an outer portion extending over the skirt of the cup shaped member;

the skirt of the cup shaped member urging the disk to assume a folded condition in which the disk defines a cavity; and wherein the disk forms a plurality of undulations along a periphery of the disk while the disk is in the folded condition.

18. The assembly of claim 17, wherein the undulations include a plurality of valleys defining a first cone.

19. The assembly of claim 18, wherein the undulations include a plurality of peaks defining a second cone.

20. The assembly of claim 19, wherein the second cone is coaxial with the first cone.

21. The assembly of claim 17, wherein the skirt is dimensioned to urge an outer portion of the disk out of plane with a central portion of the disk so that the disk defines a cavity when the skirt is disposed in a resting shape.

22. The assembly of claim 17, wherein the skirt has a level a resilience allowing the skirt to assume a stretched shape while the disk is assuming a generally planar condition.

23. The assembly of claim 17, wherein the disk comprises a first material and the cup shaped member comprises a second material different from the first material.

24. The assembly of claim 17, wherein the disk is substantially unstretched while the disk is in the folded condition.

25. The assembly of claim 17, wherein the disk has a first diameter and a first edge length while the disk is in a generally planar condition;

wherein the disk has a second diameter and a second edge length while the disk is in the folded condition;

the second diameter being smaller than the first diameter; and the second edge length being substantially equal to the first edge length.

26. An assembly, comprising:

a cup shaped member including a mid portion and a skirt disposed about the mid portion;

a disk having a central portion fixed to the mid portion of the cup shaped member and an outer portion extending over the skirt of the cup shaped member;

the skirt of the cup shaped member urging the disk to assume a folded condition in which the disk defines a cavity;

wherein the disk comprises a first material and the cup shaped member comprises a second material different from the first material; and wherein the first material comprises a non-elastomeric material and the second material comprises an elastomeric material.

27. The assembly of claim 26, the disk comprises low density polyethylene.

28. The assembly of claim 26, wherein the disk is substantially unstretched while the disk is in the folded condition.

29. The assembly of claim 26, wherein the disk has a first diameter and a first edge length while the disk is in a generally planar condition;

wherein the disk has a second diameter and a second edge length while the disk is in the folded condition;

the second diameter being smaller than the first diameter; and the second edge length being substantially equal to the first edge length.

30. The assembly of claim 26, wherein the skirt is dimensioned to urge an outer portion of the disk out of plane with a central portion of the disk so that the disk defines a cavity when the skirt is disposed in a resting shape.

31. The assembly of claim 26, wherein the skirt has a level a resilience allowing the skirt to assume a stretched shape while the disk is assuming a generally planar condition.

32. A method, comprising the steps of:

providing a disk having a generally planar resting condition;

urging an outer portion of the disk out of plane with a central portion of the disk so that the disk defines a cavity;

placing a source of relatively low pressure in fluid communication with the cavity defined by the disk;

positioning the disk against the workpiece; and wherein the step of urging an outer portion of the disk out of plane with a central portion of the disk includes forming a plurality of undulations in the disk without substantially stretching the disk.

33. The method of claim 32, wherein an edge length of an outer edge of the disk remains substantially constant while the outer portion of the disk is urged out of plane with the central portion of the disk.

34. The method of claim 32, further including the step of unfolding the disk to remove the undulations from the disk.

35. The method of claim 32, further including the step of unfolding the disk so that the disk conforms to a surface of the workpiece.

36. The method of claim 32, further including the step of moving the workpiece.

37. The method of claim 36, wherein the step of moving the workpiece occurs while the disk is positioned against the workpiece.

38. The method of claim 32, further including the step of lifting the workpiece.

39. The method of claim 38, wherein the step of lifting the workpiece occurs while the disk is positioned against the workpiece.

40. A method, comprising the steps of:

providing a disk having a generally planar resting condition;

urging an outer portion of the disk out of plane with a central portion of the disk so that the disk defines a cavity;

placing a source of relatively low pressure in fluid communication with the cavity defined by the disk;

positioning the disk against the workpiece;

wherein the step of urging the outer portion of the disk out of plane relative to the central portion of the disk comprises the step of adhering the central portion of the disk to a mid portion of a cup shaped member so that a skirt portion of the cup shaped member urges the outer portion of the disk out of plane with the central portion of the disk.

41. The method of claim 40, wherein an edge length of an outer edge of the disk remains substantially constant while the outer portion of the disk is urged out of plane with the central portion of the disk.

42. The method of claim 40, further including the step of moving the workpiece.

43. The method of claim 42, wherein the step of moving the workpiece occurs while the disk is positioned against the workpiece.

44. The method of claim 40, further including the step of lifting the workpiece.

45. The method of claim 44, wherein the step of lifting the workpiece occurs while the disk is positioned against the workpiece.

\* \* \* \* \*